United States Patent
Yonetsu et al.

(10) Patent No.: US 12,160,959 B2
(45) Date of Patent: Dec. 3, 2024

(54) BONDED BODY, CERAMIC COPPER CIRCUIT BOARD, METHOD FOR MANUFACTURING BONDED BODY, AND METHOD FOR MANUFACTURING CERAMIC COPPER CIRCUIT BOARD

(71) Applicants: KABUSHIKI KAISHA TOSHIBA, Tokyo (JP); TOSHIBA MATERIALS CO., LTD., Yokohama (JP)

(72) Inventors: Maki Yonetsu, Mitaka (JP); Seiichi Suenaga, Yokohama (JP); Sachiko Fujisawa, Kawasaki (JP); Takashi Sano, Fujisawa (JP)

(73) Assignees: KABUSHIKI KAISHA TOSHIBA, Tokyo (JP); TOSHIBA MATERIALS CO., LTD., Yokohama (JP)

( * ) Notice: Subject to any disclaimer, the term of this patent is extended or adjusted under 35 U.S.C. 154(b) by 63 days.

(21) Appl. No.: 17/826,464

(22) Filed: May 27, 2022

(65) Prior Publication Data

US 2022/0295644 A1    Sep. 15, 2022

Related U.S. Application Data

(63) Continuation of application No. PCT/JP2021/009040, filed on Mar. 8, 2021.

(30) Foreign Application Priority Data

Mar. 18, 2020 (JP) ................................ 2020-048222

(51) Int. Cl.
*H05K 3/38* (2006.01)
*H05K 1/03* (2006.01)

(52) U.S. Cl.
CPC .......... *H05K 3/388* (2013.01); *H05K 1/0306* (2013.01); *H05K 2203/04* (2013.01)

(58) Field of Classification Search
CPC .............................................. Y10T 428/12611
See application file for complete search history.

(56) References Cited

U.S. PATENT DOCUMENTS

2009/0283309 A1*  11/2009  Naba .................. B23K 35/0222
                                                            428/656
2015/0257252 A1     9/2015  Kato et al.
(Continued)

FOREIGN PATENT DOCUMENTS

EP    0 681 322 A2    11/1995
EP    2 579 696 A1     4/2013
(Continued)

OTHER PUBLICATIONS

International Search Report issued May 18, 2021 in PCT/JP2021/009040 filed on Mar. 8, 2021, 2 pages.

*Primary Examiner* — Adam Krupicka
(74) *Attorney, Agent, or Firm* — Oblon, McClelland, Maier & Neustadt, L.L.P.

(57) ABSTRACT

A bonded body includes a ceramic substrate and a copper plate, in which the copper plate is bonded to the ceramic substrate via a bonding layer, the copper plate includes a surface perpendicular to a direction in which the ceramic substrate and the copper plate are bonded, and a number percentage of copper crystal grains having major diameters greater than 400 μm in three 5 mm×5 mm regions included in the surface is not less than 0% and not more than 5%. The bonding temperature is favorably not more than 800° C. The number percentage of the copper crystal grains having major diameters greater than 400 μm is favorably not more than 1%.

18 Claims, 3 Drawing Sheets

(56) References Cited

U.S. PATENT DOCUMENTS

| | | | |
|---|---|---|---|
| 2015/0282379 A1* | 10/2015 | Terasaki | C04B 37/026 |
| | | | 361/720 |
| 2019/0084893 A1 | 3/2019 | Herbst et al. | |
| 2019/0327831 A1 | 10/2019 | Kato et al. | |
| 2020/0128664 A1 | 4/2020 | Harada et al. | |

FOREIGN PATENT DOCUMENTS

| | | |
|---|---|---|
| EP | 3 492 441 A1 | 6/2019 |
| JP | 08-139420 A | 5/1996 |
| JP | 11-121889 A | 4/1999 |
| JP | 2007-066995 A | 3/2007 |
| JP | WO2018/021472 A1 | 2/2018 |
| JP | WO2018/199060 A1 | 11/2018 |
| WO | WO 2018/180965 A1 | 10/2018 |

* cited by examiner

BONDED BODY, CERAMIC COPPER CIRCUIT BOARD, METHOD FOR MANUFACTURING BONDED BODY, AND METHOD FOR MANUFACTURING CERAMIC COPPER CIRCUIT BOARD

CROSS-REFERENCE TO RELATED APPLICATIONS

This is a continuation application of International Patent Application PCT/JP2021/009040, filed on Mar. 8, 2021. This application also claims priority to Japanese Patent Application No. 2020-048222, filed on Mar. 18, 2020. The entire contents of which are incorporated herein by reference.

FIELD

Embodiments described below relate to a bonded body, a ceramic copper circuit board, a method for manufacturing a bonded body, and a method for manufacturing a ceramic copper circuit board.

BACKGROUND

A bonded body of a ceramic substrate and a copper plate is used in a circuit board on which a semiconductor element or the like is mounted. International Publication No. 2018/021472 discusses a ceramic copper circuit board in which a ceramic substrate and a copper plate are bonded. In International Publication No. 2018/021472, a brazing material that includes Ag, Cu, Ti, or the like is used as a bonding layer. Also, TCT characteristics are improved by controlling the nanoindentation hardness of the bonding layer. In International Publication No. 2018/021472, the nanoindentation hardness is controlled by causing a AgTi crystal, TiC, etc., to exist in the bonding layer. In International Publication No. 2018/021472, the bonding strength and the TCT characteristics are improved by controlling the nanoindentation hardness.

In International Publication No. 2018/021472, the bonding is performed at a high bonding temperature of 780 to 850° C. The load of the bonding equipment increases when the bonding temperature is high. Also, in bonding at high temperatures, thermal stress is applied to the ceramic substrate and the copper plate. The load of the thermal stress is a cause of distortion of the ceramic copper circuit board. It is therefore desirable to bond at a lower temperature.

For example, International Publication No. 2018/199060 discusses a ceramic copper circuit board that is bonded at a bonding temperature of 720 to 800° C.

DETAILED DESCRIPTION

A bonded body according to an embodiment includes a ceramic substrate, and a copper plate bonded to the ceramic substrate via a bonding layer. The copper plate includes a surface perpendicular to a direction in which the ceramic substrate and the copper plate are bonded, and a number percentage of copper crystal grains having major diameters greater than 400 µm in three 5 mm×5 mm regions included in the surface is not less than 0% and not more than 5%.

Figure 1:
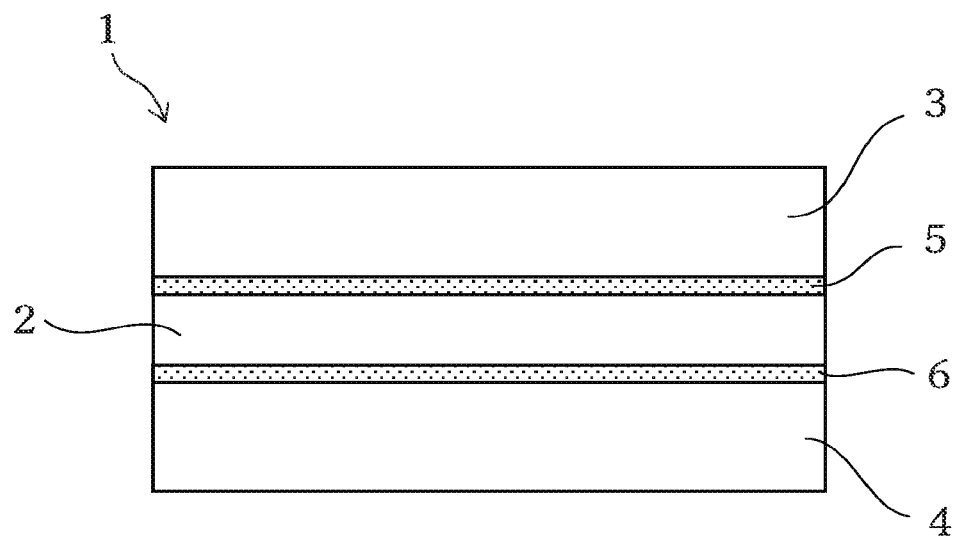
FIG. 1 is a drawing showing an example of a bonded body according to an embodiment.

FIG. 1 shows an example of a bonded body according to an embodiment. In FIG. 1, 1 is the bonded body. 2 is a ceramic substrate. 3 is a copper plate (a front copper plate). 4 is a copper plate (a back copper plate). 5 is a bonding layer (a front bonding layer). 6 is a bonding layer (a back bonding layer). In the example of FIG. 1, the longitudinal size and the lateral size of the ceramic substrate are respectively equal to the longitudinal size and the lateral size of the copper plate.

The bonded body 1 includes a structure in which the copper plate 3 and the copper plate 4 are bonded to two surfaces of the ceramic substrate 2 respectively via the bonding layer 5 and the bonding layer 6. For convenience, the copper plate 3 is called the front copper plate; and the bonding layer 5 is called the front bonding layer. Also, the copper plate 4 is called the back copper plate; and the bonding layer 6 is called the back bonding layer. In the example of FIG. 1, copper plates are bonded to two surfaces of the ceramic substrate. The bonded body according to the embodiment is not limited to such a configuration. The copper plate size is modifiable as appropriate. Also, a copper plate may be bonded to only one surface of the ceramic substrate.

Figure 2:
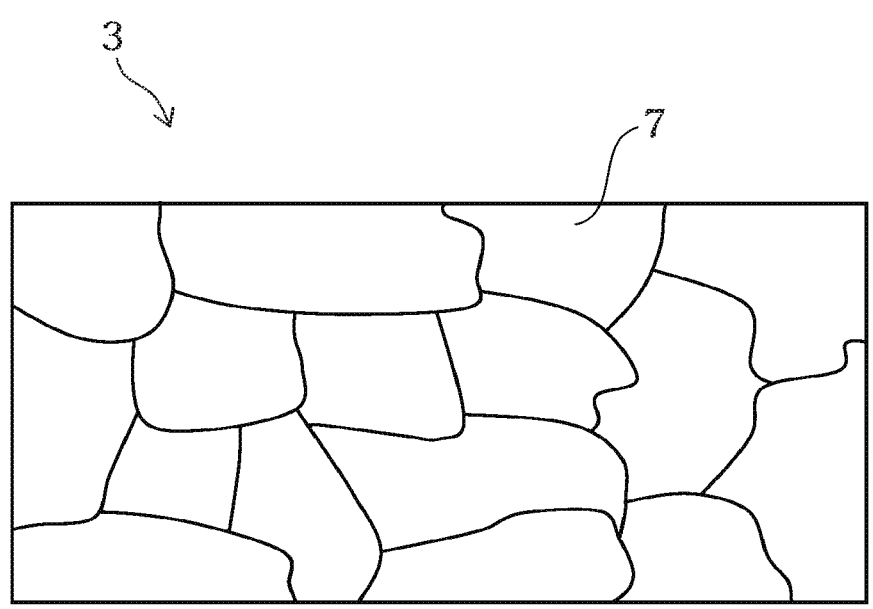
FIG. 2 is a drawing showing an example of a crystal structure of a copper plate.

FIG. 2 shows an example of the crystal structure of the copper plate. In FIG. 2, 3 is the copper plate. 7 is a copper crystal grain. The copper plate is a polycrystal. For example, each copper crystal grain has a face-centered cubic structure.

The copper crystal grains are observed in an enlarged photograph. The enlarged photograph is imaged by an optical microscope or a scanning electron microscope (SEM). Chemical polishing or etching may be performed when it is difficult to confirm the grain boundaries. The magnification is set to be not less than 100 times. The observation object is the surface of the copper plate perpendicular to the direction in which the ceramic substrate and the copper plate are bonded. The thickness of the copper plate removed by the chemical polishing or the etching is set to be not more than one copper crystal grain in the bonding direction. This is because the surface is no longer the so-called copper plate surface when a thickness of not less than two copper crystal grains is removed. That is, the copper plate surface refers to the copper plate surface when used as the ceramic copper circuit board. For example, not more than 10 µm is set as the thickness of not more than one copper crystal grain.

5 mm×5 mm is used as the unit area; a region having a 5 mm×5 unit area mm is used as one observation region. The major diameters of the copper crystal grains visible in a 5 mm×5 unit area mm of the enlarged photograph are measured. The major diameter of the copper crystal grain corresponds to the longest distance among the distances between two points on the outer edge of the copper crystal grain. Only the copper crystal grains that have completely visible contours in the 5 mm×5 mm unit area are used as the measurement object. Regions of the 5 mm×5 mm unit area are observed at three locations, and the total grain index is measured. The grain index is a value obtained by using the major diameters of the copper crystal grains in the regions to determine the number percentage. Three regions that are sufficiently separated from each other are selected as the observation regions. The observation regions are randomly selected. Also, copper crystal grains of which the contour is cut off at the edge of the enlarged photograph are not included in the measurement object. Also, when the 5 mm×5 mm unit area cannot be observed in one field, a 5 mm×5 mm photograph may be obtained by linking multiple adjacent enlarged photographs to each other.

In the bonded body according to the embodiment, the number percentage of copper crystal grains having major diameters greater than 400 µm in three observation regions of the copper plate surface is not less than 0% and not more than 5%. This indicates that the number percentage of the copper crystal grains 7 having major diameters not more than 400 µm is not less than 95%.

The copper crystal grains that have major diameters greater than 400 µm are large grains that underwent grain growth in heat treatment. When bonding the ceramic substrate and the copper plate via the bonding layer, the copper plate is exposed to a high temperature of about 800° C. Grain growth of the copper plate occurs at elevated temperatures. Warp easily occurs in the bonded body when grain growth occurs in directions parallel to the surface and large grains are formed. The inventors of the invention of the application discovered that the warp becomes large when the copper crystal grains having major diameters greater than 400 µm in a 5 mm×5 mm unit area of the surface are not less than 6%. In particular, the warp easily occurs when the bonded body is large. According to the bonded body according to the embodiment, the warp can be reduced because the number of copper crystal grains having major diameters of greater than 400 µm is suppressed.

The grain growth in a cross-sectional direction perpendicular to the surface does not easily affect the warp of the bonded body. Therefore, as long as the number percentage at the copper plate surface is not less than 0% and not more than 5%, the number percentage of copper crystal grains having major diameters greater than 400 µm at the cross section may be greater than 5%.

It is favorable for the number percentage of the copper crystal grains having major diameters greater than 400 µm to be not more than 1%. It is favorable for the major diameter of the copper crystal grain 7 to be not more than 300 µm. The suppression effect of the warp is further improved when the major diameter of the copper crystal grain 7 is small, i.e., not more than 300 µm.

The lower limit of the major diameter of the copper crystal grain is not particularly limited. Favorably, the major diameter is not less than 10 µm. There is a possibility that a copper plate that has a small copper crystal grain 7 size may increase the manufacturing cost.

It is favorable for the average value of the major diameters of the copper crystal grains 7 to be not less than 30 µm and not more than 300 µm.

The average value of the major diameters of the copper crystal grains 7 is the average value of the major diameters of the copper crystal grains visible in a 5 mm×5 mm unit area at three locations. Only the copper crystal grains that have completely visible contours in one 5 mm×5 mm unit area are selected as the measurement object. The average value is obtained by observing the 5 mm×5 mm unit area at three locations and by calculating the average of the major diameters of the copper crystal grains that are the measurement object. The average value is calculated as the number percentage. For example, when five copper crystal grains having major diameters of 350 µm, 220 µm, 200 µm, 120 µm, and 40 µm are observed, the average value of the major diameters is 186 µm (=(350+220+200+120+40)÷5).

The copper crystal grains are too small when the average value of the major diameters is less than 30 µm. When the copper plate includes aggregates of small crystal grains, the effects that occur when large crystal grains exist are large. Also, when the average value of the major diameters is greater than 300 µm, the likelihood of an increase of the number of copper crystal grains having major diameters greater than 400 µm becomes high. It is therefore favorable for the average value of the major diameters to be not less than 30 µm and not more than 300 µm, and more favorably not less than 50 µm and not more than 150 µm.

Also, it is favorable for the number percentage of copper crystal grains having major diameters within an average range to be not less than 80%. The average range is not less than 0.5 times and not more than 2 times the average value of the major diameters of the copper crystal grains. Small copper crystal grains or large copper crystal grains easily cause local stress due to grain growth. It is therefore favorable for a large number of copper crystal grains to have sizes close to the average value. Accordingly, it is favorable for the number percentage of copper crystal grains having major diameters within the average range to be not less than 80%, and more favorably not less than 90% and not more than 100%.

The number percentage with respect to the average value can be discriminated by measuring the grain size distribution. The major diameters of the copper crystal grains visible in the 5 mm×5 mm unit area are measured. Three locations of the 5 mm×5 mm unit area are measured; and a grain size distribution graph is determined. Or, the grain size distribution graph may be obtained by performing image analysis of the enlarged photograph.

Also, it is favorable for an arithmetic average waviness Wa of the waviness curve of the ceramic substrate to be not more than 2 µm, and for a maximum cross-sectional height Wt of the waviness curve to be not more than 10 µm.

The waviness curve is the contour curve obtained by applying a phase compensation filter having cutoff values $\lambda f$ and $\lambda c$ to the profile curve. The waviness curve is measured in accordance with JIS-B-0601 (2013) (ISO 4287).

Wa being not more than 2 µm and Wt being not more than 10 µm indicates that the unevenness of the ceramic substrate surface is small. When the unevenness of the ceramic substrate surface is large, the way that heat is conducted to the copper plate when bonding is partially different. When the way that heat is conducted is partially different, the bondability is partially affected. When the ceramic substrate is enlarged, such effects easily cause warp.

A silicon nitride substrate, an aluminum nitride substrate, an aluminum oxide substrate, an Alumina zirconia substrate substrate, etc., are examples of the ceramic substrate.

It is favorable for the thickness of the ceramic substrate to be not less than 0.1 mm and not more than 1 mm. When the substrate thickness is less than 0.1 mm, there is a possibility that the strength may decrease. Also, when the thickness is greater than 1 mm, there is a possibility that the ceramic substrate may become a thermal resistor, and the heat dissipation of the bonded body may be degraded.

It is favorable for the three-point bending strength of the silicon nitride substrate to be not less than 600 MPa. Also, it is favorable for the thermal conductivity of the silicon nitride substrate to be not less than 80 W/m·K. The substrate thickness can be thinned by increasing the strength of the silicon nitride substrate. It is therefore favorable for the three-point bending strength of the silicon nitride substrate to be not less than 600 MPa, and more favorably not less than 700 MPa. Thereby, the substrate thickness of the silicon nitride substrate can be thinned to be not more than 0.40 mm, and even not more than 0.30 mm.

The three-point bending strength of the aluminum nitride substrate is about 300 to 450 MPa. On the other hand, the thermal conductivity of the aluminum nitride substrate is not less than 160 W/m·K. Because the strength of the aluminum nitride substrate is low compared to the silicon nitride substrate, it is favorable for the substrate thickness to be not less than 0.60 mm.

Also, although the three-point bending strength of the aluminum oxide substrate is about 300 to 450 MPa, the aluminum oxide substrate is inexpensive. Also, although the three-point bending strength of the Alumina zirconia substrate is high, i.e., about 550 MPa, the thermal conductivity of the Alumina zirconia substrate is about 30 to 50 W/m·K.

It is favorable for the ceramic substrate to be one of a silicon nitride substrate or an aluminum nitride substrate. The bonding strength with the copper plate can be increased for a silicon nitride substrate or an aluminum nitride substrate by using active metal bonding described below. In particular, a silicon nitride substrate is favorable. Because a silicon nitride substrate has a high strength, excellent reliability can be obtained even when a thick copper plate is bonded to the silicon nitride substrate.

It is favorable for the bonding layer to include an active metal. The active metal is one selected from Ti (titanium), Zr (zirconium), and Hf (hafnium). A brazing material that includes an active metal is called an active metal brazing material. Also, a bonding method that uses an active metal brazing material is called active metal bonding. A bonded body is obtained by disposing the active metal brazing material between the ceramic substrate and the copper plate and by performing heat treatment. The active metal brazing material becomes the bonding layer after the bonded body is obtained. Also, Ti is favorable as the active metal. Ti is a metal that is more active than Zr or Hf. Also, the cost of Ti is inexpensive compared to Zr and Hf. The active metal is not limited to a simple metal and may be added to the brazing material as a compound or an alloy. A hydride, an oxide, a nitride, etc., are examples of the compound.

Also, it is favorable for the active metal brazing material to include one, two, or more selected from Ag (silver), Cu (copper), Sn (tin), In (indium), and C (carbon) as components other than the active metal. Ag or Cu is a component used as the base material of the brazing material. Sn or In has the effect of lowering the melting point of the brazing material. C has the effect of controlling the fluidity of the brazing material and/or controlling the structure of the bonding layer by reacting with other components. Therefore, Ag—Cu—Ti, Ag—Cu—Sn—Ti, Ag—Cu—Ti—C, Ag—Cu—Sn—Ti—C, Ag—Ti, Cu—Ti, Ag—Sn—Ti, Cu—Sn—Ti, Ag—Ti—C, Cu—Ti—C, Ag—Sn—Ti—C, and Cu—Sn—Ti—C are examples of components of the brazing material. Also, In may be used instead of Sn. Both Sn and In may be used. Instead of Sn and In, a low melting-point metal such as Bi (bismuth), Sb (antimony), Ga (gallium), etc., may be used.

It is favorable for the composition of the active metal brazing material to include not less than 0 mass % and not more than 75 mass % of Ag (silver), not less than 15 mass % and not more than 85 mass % of Cu (copper), and not less than 1 mass % and not more than 15 mass % of Ti (titanium) or $TiH_2$ (titanium hydride). When both Ti and $TiH_2$ are used, it is favorable for the total of Ti and $TiH_2$ to be within the range of 1 to 15 mass %. When both Ag and Cu are used, it is favorable for Ag to be 20 to 60 mass %, and Cu to be 15 to 40 mass %.

As necessary, the brazing material may include not less than 1 mass % and not more than 50 mass % of one or two of Sn (tin) or In (indium). It is favorable for the content of Ti or $TiH_2$ to be 1 to 15 mass %. Also, as necessary, the brazing material may include not less than 0.1 mass % and not more than 2 wt % of C (carbon).

The ratios of the composition of the active metal brazing material are calculated using the total of the mixed raw materials as 100 mass %. For example, when the brazing material includes the three of Ag, Cu, and Ti, Ag+Cu+Ti=100 mass %. When the brazing material includes the four of Ag, Cu, $TiH_2$, and In, Ag+Cu+$TiH_2$+In=100 mass %. When the brazing material includes the five of Ag, Cu, Ti, Sn, and C, Ag+Cu+Ti+Sn+C=100 mass %.

Also, it is favorable for the bonding layer to include Ag, Cu, and Ti. The bonding layer including Ag, Cu, and Ti means that the active metal brazing material includes Ag, Cu, and Ti. A Ag—Cu—Ti brazing material increases the bonding strength. Also, a Ag—Cu—Ti—Sn brazing material can lower the bonding temperature by lowering the melting point of the brazing material.

By setting the bonding temperature to be not more than 700° C., the diffusion amount of Ag into the copper plate can be suppressed. The diffusion of Ag into the surface of the copper plate can be suppressed. Also, by setting the bonding temperature to be not more than 700° C., Ag is mainly diffused into the crystal grain boundaries of the copper plate. The inhibition of the etching of the copper plate by the diffused Ag can be suppressed thereby.

A method for manufacturing the bonded body will now be described. The manufacturing method is not limited as long as the bonded body according to the embodiment has the configuration described above. Here, the following examples are illustrated as methods for obtaining the bonded body with a high yield.

The method for manufacturing the bonded body according to the embodiment includes a process of disposing a brazing material used as a bonding layer between a ceramic substrate and a copper plate, and a bonding process in which the bonding temperature is not more than 800° C.

First, the process of disposing a copper plate on the ceramic substrate with the brazing material used as the bonding layer interposed is performed. The brazing material is the active metal brazing material described above. The active metal brazing material is a brazing material that includes an active metal such as Ti, etc. The active metal may be added as an active metal compound such as a hydride, etc. It is favorable for the active metal brazing material to include one, two, or more selected from Ag (silver), Cu (copper), Sn (tin), In (indium), and C (carbon) as components other than the active metal.

First, an active metal brazing material paste is prepared by performing a process of mixing the necessary components. To obtain the paste, it is effective to mix a binder and/or a solvent.

The active metal brazing material paste is coated onto at least one of the ceramic substrate or the copper plate. It is favorable for the thickness of the active metal brazing material paste to be not less than 5 μm and not more than 60 μm. The thickness of the active metal brazing material paste is the thickness after the coated paste is dried. When the thickness is less than 5 μm, there is a possibility that the bonding strength may decrease. Also, when the thickness is thick, i.e., greater than 60 μm, there is a possibility that the thermal stress in the bonding process may become large, and the warp of the bonded body may become large. It is therefore favorable for the thickness of the active metal brazing material paste to be not less than 5 μm and not more than 60 μm, and more favorably not less than 10 μm and not more than 50 μm.

After performing the process of coating the active metal brazing material paste onto one, a process of placing the other not coated with the paste on the one is performed. For example, when the active metal brazing material paste is coated onto the ceramic substrate, a process of placing the copper plate on the ceramic substrate with the active metal brazing material paste interposed is performed. The active metal brazing material paste may be coated onto two surfaces of the ceramic substrate; and copper plates may be disposed at the two surfaces. The active metal brazing material paste may be coated onto the copper plate; and the ceramic substrate may be disposed on the copper plate with the active metal brazing material paste interposed.

Then, a bonding process in which the bonding temperature is not more than 800° C. is performed. The bonding temperature refers to the maximum temperature among the temperatures maintained for constant intervals in the bonding process. When the bonding temperature is high, the grain growth of the copper crystal grains included in the copper plate is promoted. In conventional active metal bonding, the bonding temperature is about 850° C. When the bonding temperature is greater than 800° C., the grain growth of the copper plate becomes large. When the grain growth of the copper plate is large, large copper crystal grains having major diameters greater than 400 μm are easily generated.

It is favorable for the bonding temperature to be not more than 800° C., and more favorably not more than 700° C. Although not particularly limited, it is favorable for the lower limit of the bonding temperature to be not less than 500° C. When the bonding temperature is low, there is a possibility that the reliability of the bond may degrade. It is therefore favorable for the bonding temperature to be not less than 500° C. and not more than 800° C., and more favorably not less than 550° C. and not more than 700° C. Also, it is favorable for the holding time of the bonding temperature to be not more than 60 minutes, and more favorably not more than 30 minutes. Although not particularly limited, it is favorable for the lower limit of the holding time to be not less than 1 minute. When the lower limit is less than 1 minute, there is a possibility that the Ag diffusion may be insufficient, and the bondability may not be stable.

Also, it is favorable for $B/A \leq 10$ to be satisfied, in which A (μm) is the average grain size of the copper plate before bonding, and B (μm) is the average grain size of the copper plate after bonding. Also, it is more favorable for $1.1 \leq B/A \leq 5$ to be satisfied.

$B/A \leq 10$ means that the ratio of the grain growth before and after bonding is not more than 10 times. The grain growth is the phenomenon in which the copper crystal grains of the copper plate are made larger by heat. Stress is generated in the grain growth because the individual copper crystal grains become larger. When B/A is large, i.e., greater than 10 times, the stress becomes too large, and the warp of the bonded body easily occurs. It is therefore favorable for B/A to satisfy $B/A \leq 10$, and more favorably $1.1 \leq B/A \leq 5$.

The average grain size A can be calculated using the following method. Three regions of a 5 mm×5 mm unit area included in the surface of the copper plate before bonding are observed. The copper crystal grains that are the measurement object are selected in the regions. The major diameters of the same selected crystal grains are measured. The average grain size is obtained by calculating the average of the major diameters.

The average grain size B is the average value of the major diameters obtained from the result of observing the three regions of the 5 mm×5 mm unit area as described above.

It is favorable for the largest endothermic peak of the DSC curve of the bonding brazing material to be at not more than 700° C. To suppress the grain growth, it is effective to set the bonding temperature to be not more than 800° C. It is therefore effective for the melting point of the brazing material to be not more than 700° C. Favorably, the melting point of the brazing material is not less than 550° C. and not more than 700° C.

The DSC curve is a curve obtained using a differential scanning calorimeter (DSC) to measure the peaks of endothermic reactions and/or exothermic reactions. A peak in the negative direction indicates that an endothermic reaction has occurred. A peak in the positive direction indicates that an exothermic reaction has occurred.

The DSC curve is measured over a temperature profile made of a heating process, a holding process at a constant temperature, and a cooling process. In this temperature profile, the heating process heats from room temperature to 500° C. at a heating rate of 5° C./min. Then, the heating process maintains 500° C. for 60 minutes. Then, the heating process heats to 845° C. at a heating rate of 5° C./min. Subsequently, the holding process maintains the temperature of 845° C. for 30 minutes. The cooling process cools from 845° C. to room temperature at a cooling rate of 5° C./min.

The TGA-DSC simultaneous thermal analyzer STA449-F3-Jupiter manufactured by NETZSCH or an apparatus having equivalent performance can be used as the DSC. Also, the measurement is performed in an Ar (argon) flow by dropping the appropriate amount of the brazing material into an alumina container. It is necessary to prevent the brazing material and the atmosphere from reacting by measuring in an Ar atmosphere. Also, the flow rate of the Ar flow is set to 20 ml/minute at the sample side and 200 ml/minute at the cooling side.

In the DCS curve, the detected temperature of the largest endothermic peak in the temperature range of not less than 550° C. and not more than 800° C. in the heating process is taken to be the melting point. The melting point of the brazing material being not more than 700° C. means that the largest endothermic peak exists within the range of 550 to 700° C. Even if there is a peak in the negative direction at less than 550° C., such a peak may not be counted as an endothermic peak. Such an endothermic reaction is caused by melting, decomposition, etc., of the active metal brazing material. For example, when titanium hydride ($TiH_2$) is used as the active metal, a peak in the negative direction is detected at about 500° C. The peak indicates an endothermic reaction occurring when $TiH_2$ decomposes into Ti and H. Therefore, the detected temperature of the largest endothermic peak in the temperature range of not less than 550° C. and not more than 800° C. is taken to be the melting point.

It is favorable for the melting point of the active metal brazing material to be within the range of not less than 550° C. and not more than 700° C., and more favorably within the range of not less than 550° C. and not more than 650° C. By lowering the melting point, the grain growth of copper crystal grains can be suppressed. $B/A \leq 10$, and even $1.1 \leq B/A \leq 5$ can be realized thereby.

To control the melting point of the active metal brazing material, it is effective to control the composition, the grain size of the raw material powder, etc. As described above, Sn or In has the effect of lowering the melting point of the brazing material. It is effective to set the powder particle size of Sn or In to be the largest among the components included in the brazing material. For example, when a Ag—Cu—Sn—Ti brazing material is used, the grain size of the Sn powder is the largest among the Ag powder, the Cu powder, the Sn powder, and the Ti powder. Sn is an element that easily reacts with the other brazing material components. By increasing the grain size of the Sn powder, Sn powder easily contacts the other components. The melting point of the brazing material can be lowered thereby. It is similar even when In is used instead of Sn. It is effective to set the grain sizes of components having the effect of lowering the melting point to be greater than the grain sizes of the other components. Also, lowering the bonding temperature can reduce the load of the bonding equipment.

A pure copper plate and/or a copper alloy plate can be used as the copper plate. It is favorable for the copper plate to be oxygen-free copper. As described in JIS-H-3100, oxygen-free copper has a copper purity of not less than 99.96 wt %. Also, it is favorable for the average value of the major diameters of the copper crystal grains of the copper plate before bonding to be not less than 10 μm and not more than 200 μm. When the average value of the major diameters is less than 10 μm, there is a possibility that fine copper crystal grains that easily undergo grain growth may increase. Also, when the average value is greater than 200 μm, there is a possibility that the number of copper crystal grains having major diameters greater than 400 μm after bonding may increase. It is therefore favorable for the average value of the major diameters before bonding to be not less than 10 μm and not more than 200 μm, and more favorably not less than 20 μm and not more than 150 μm. The average value of the major diameters before bonding can be prepared by changing the processing rate, etc. The processing rate is represented by the percent (%) of the difference between the cross-sectional area of the material before processing and the cross-sectional area after processing divided by the cross-sectional area of the material before processing.

By the processes described above, a bonded body can be manufactured in which the ceramic substrate and the copper plate are bonded. By bonding at a bonding temperature that is not more than 800° C., the grain growth of copper crystals can be suppressed. Thereby, the warp amount can be reduced even when the bonded body is enlarged. When the bonded body is enlarged, multiple components can be obtained from the bonded body. Obtaining multiple components is a method of obtaining small bonded bodies by cutting a large bonded body. There is also a method of subdividing the bonded body or a method of subdividing the ceramic copper circuit board. Scribing may be performed to easily subdivide. According to the embodiment, the warp amount of the bonded body can be reduced to be not more than 0.1 mm even when the size of the ceramic substrate 2 is enlarged to be not less than 200 mm long and not less than 200 mm wide. Also, by setting the bonding temperature to be not more than 700° C., the diffusion amount of Ag into the copper plate can be suppressed.

Figure 3:
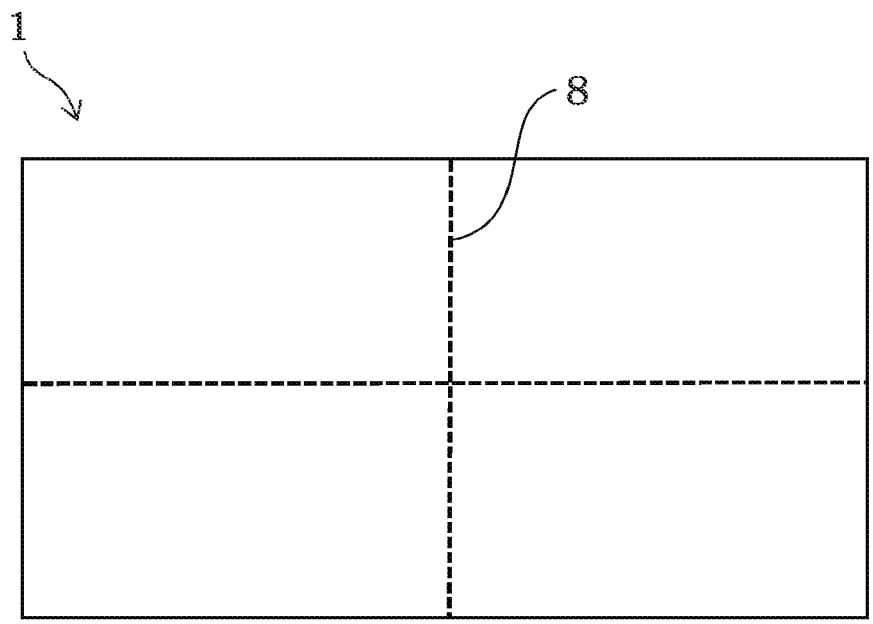
FIG. 3 is a drawing showing an example for obtaining multiple components.

FIG. 3 shows an example of a bonded body for obtaining multiple components. In FIG. 3, 1 is the bonded body; and 8 is a scribe line. The scribe line 8 is a subdividing trench. Various subdividing trenches are possible such as a dot configuration, a line shape, etc. Also, the subdividing trench may be provided in only one surface or may be provided in two surfaces. The scribe line 8 is formed by laser patterning, etc. FIG. 3 shows an example in which the scribe line 8 for subdividing the bonded body 1 into four is provided. The conditions of providing the scribe line 8 are not limited to the examples and are modifiable as appropriate. Small ceramic copper circuit boards may be obtained by subdividing a large ceramic copper circuit board. In other words, multiple components may be obtained from the bonded body, and multiple components may be obtained from a ceramic copper circuit. Obtaining multiple components is a method having good suitability for mass production.

Figure 4:
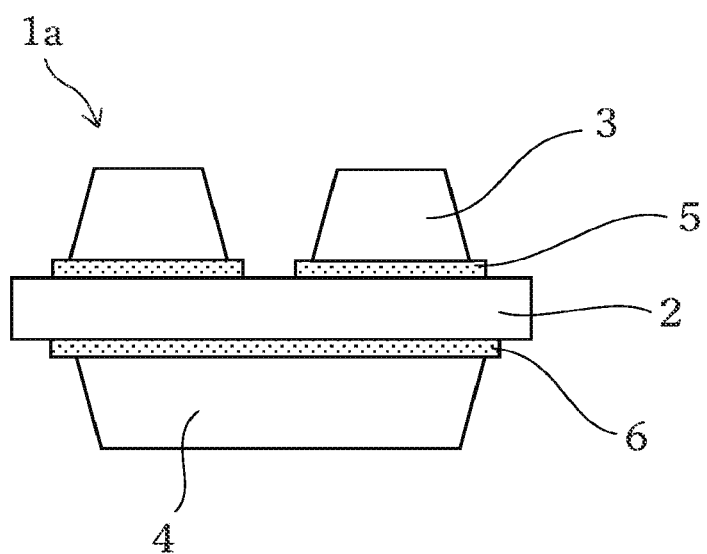
FIG. 4 is a drawing showing another example of a ceramic copper circuit board according to the embodiment.

Also, a ceramic copper circuit board is manufactured by providing a circuit structure to the copper plate of the bonded body 1. An etching process is effective for providing the circuit structure. FIG. 4 shows an example of a ceramic copper circuit board 1a provided with a circuit structure.

FIG. 4 illustrates the front copper plate 3 that is patterned into a circuit structure. The embodiment is not limited to such a form; a necessary circuit structure is applicable. Or, the copper plate that is patterned into a circuit structure may be bonded to the ceramic substrate in the manufacture of the bonded body described above. In such a case, a ceramic copper circuit board is obtained as the bonded body. Also, a sloped structure may be provided to the side surface of the copper plate. Also, a structure in which the bonding layer juts from the side surface of the copper plate may be provided.

Figure 5:
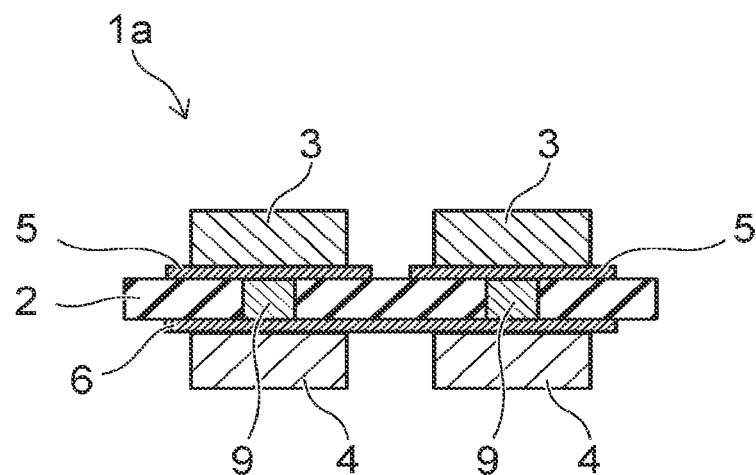
FIG. 5 is a drawing showing an example of a ceramic copper circuit board according to the embodiment.

FIG. 5 is a drawing showing an example of a ceramic copper circuit board according to the embodiment.

The through-hole may be provided in the ceramic substrate. It is favorable for the ceramic copper circuit board to have a structure in which the copper plate at the front and the copper plate at the back are electrically connected via the through-hole. FIG. 5 shows an example of a ceramic copper circuit board that has a through-hole. FIG. 5 is a cross-sectional view at a portion where the through-hole is provided. In FIG. 5, 1a is a ceramic copper circuit board. 2 is a silicon nitride substrate. 3 is a front copper plate. 4 is a back copper plate. 5 and 6 are bonding layers. 9 is a through-hole. In FIG. 5, the front copper plate 3 and the back copper plate 4 are electrically connected via the through-hole 9. In FIG. 5, multiple through-holes 9 respectively connect multiple front copper plates 3 and multiple back copper plates 4. The embodiment is not limited to such a structure. In the ceramic copper circuit board 1a, the through-hole 9 may be provided for only a portion of the multiple front copper plates 3. The through-hole 9 may be provided for only a portion of the multiple back copper plates 4. It is favorable for the same material as the bonding layer 5 or 6 to be filled into the through-hole 9. The structure inside the through-hole 9 is not particularly limited as long as the front copper plate and the back copper plate can be electrically connected. Therefore, a metal thin film may be located at only the through-hole 9 inner wall. On the other hand, the bonding strength can be increased by filling with the same material as the bonding layer 5 or 6.

Figure 6:
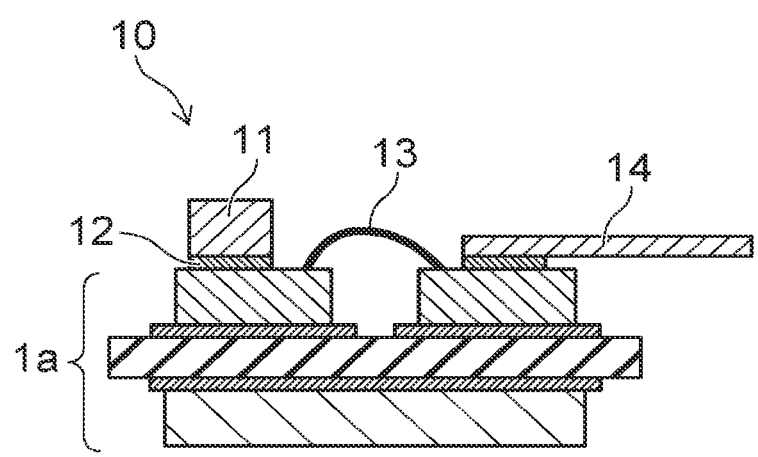
FIG. 6 is a drawing showing an example of a semiconductor device according to the embodiment.

FIG. 6 is a drawing showing an example of a semiconductor device according to the embodiment.

The ceramic copper circuit board according to the embodiment is favorable in a semiconductor device. In the semiconductor device, a semiconductor element is mounted to the copper plate of the ceramic copper circuit board via the bonding layer. FIG. 6 shows an example of the semiconductor device. In FIG. 6, 1a is a ceramic copper circuit board. 10 is a semiconductor device. 11 is a semiconductor element. 12 is a bonding layer. 13 is wire bonding. 14 is a metal terminal. In FIG. 6, the semiconductor element 11 is bonded onto the copper plate of the ceramic copper circuit board 1a via the bonding layer 12. Similarly, the metal terminal 14 is bonded via the bonding layer 12. The wire bonding 13 electrically connects between the adjacent copper plates. In FIG. 6, other than the semiconductor element 11, the wire bonding 13 and the metal terminal 14 are bonded. The semiconductor device according to the embodiment is not limited to such a structure. For example, only one of the wire bonding 13 or the metal terminal 14 may be provided. A plurality of each of the semiconductor element 11, the wire bonding 13, and the metal terminal 14 may be located at each of the front copper plates 3. The semiconductor element 11, the wire bonding 13, and the metal terminal 14 can be bonded to the back copper plate 4 as necessary. Various shapes such as a leadframe shape, a protruding shape, etc., are applicable to the metal terminal 14.

By using the bonded body according to the embodiment in the ceramic copper circuit board or the semiconductor device described above, the warp of the ceramic copper circuit board or the semiconductor device can be reduced.

EXAMPLES

Examples 1 to 7 and Comparative Examples 1 to 3

The silicon nitride substrates or the aluminum nitride substrate shown in Table 1 were prepared as the ceramic substrate.

TABLE 1

| Ceramic substrate | Thermal conductivity (W/m · K) | Three-point bending strength (MPa) | Size (mm long × mm wide × mm thick) | Waviness curve | |
|---|---|---|---|---|---|
| | | | | Arithmetic average height Wa (μm) | Maximum cross-sectional height Wt (μm) |
| SiN 1 | 90 | 700 | 230 × 200 × 0.32 | 1.8 | 8 |
| SiN 2 | 85 | 650 | 250 × 220 × 0.25 | 1.5 | 6 |
| SiN 3 | 90 | 700 | 230 × 200 × 0.32 | 3.7 | 24 |
| AlN | 170 | 400 | 230 × 200 × 0.635 | 2.2 | 6 |

Then, the copper plates shown in Table 2 were prepared. The copper plates each were oxygen-free copper.

TABLE 2

| Copper plate | Plate thickness (mm) | Average value of major diameters of copper crystal grains (μm) |
|---|---|---|
| Copper plate 1 | 0.6 | 25 |
| Copper plate 2 | 0.8 | 40 |
| Copper plate 3 | 0.3 | 29 |

Then, the active metal brazing materials shown in Table 3 were prepared. In the active metal brazing materials 1 to 3, the grain size of the Sn powder was the largest. In the active metal brazing material 4, the grain size of the Ag powder was the largest. Also, the melting point of the brazing material was the value obtained by measuring the DSC curve as described above.

TABLE 3

| Active metal brazing material | Composition (wt %) | Melting point (° C.) |
|---|---|---|
| Brazing material 1 | Ag(37.7), Cu(35), Sn(19), TiH2(8), C (0.3) | 605 |
| Brazing material 2 | Ag(44), Cu(36) Sn(16.6), TiH2(3), C (0.4) | 570 |
| Brazing material 3 | Ag(39), Ca(36), Sn(20), TiH2(5) | 612 |
| Brazing material 4 | Ag(48.7), Cu(33), Sn(10), TiH2(8), C(0.3) | 760 |

Then, a bonding process that used the ceramic substrate, the copper plate, and the active metal brazing material was performed. The longitudinal and lateral sizes of the copper plate matched the ceramic substrate. Also, in the bonding process, the bonding temperature was maintained in a vacuum of not more than $10^{-3}$ Pa for 10 to 30 minutes. The combinations of the raw materials were as shown in Table 4.

TABLE 4

|  | Silicon nitride substrate | Active metal brazing material | Copper plate | Bonding temperature (° C.) |
|---|---|---|---|---|
| Example 1 | SiN 1 | Brazing material 1 | Copper plate 1 | 680 |
| Example 2 | SiN 2 | Brazing material 1 | Copper plate 2 | 690 |
| Example 3 | SiN 3 | Brazing material 1 | Copper plate 1 | 680 |
| Example 4 | SiN 1 | Brazing material 2 | Copper plate 1 | 640 |
| Example 5 | SiN 2 | Brazing material 2 | Copper plate 2 | 650 |
| Example 6 | SiN 1 | Brazing material 3 | Copper plate 1 | 680 |
| Example 7 | SiN 2 | Brazing material 3 | Copper plate 2 | 720 |
| Example 8 | AlN | Brazing material 2 | Copper plate 3 | 660 |
| Comparative example 1 | SiN 1 | Brazing material 4 | Copper plate 1 | 850 |
| Comparative example 2 | SiN 2 | Brazing material 4 | Copper plate 2 | 850 |
| Comparative example 3 | SiN 3 | Brazing material 4 | Copper plate 1 | 700 |

The major diameters of the copper crystal grains of the copper plate, the warp amount of the bonded body, and the bonding strength were measured for the obtained bonded bodies.

For the major diameter, SEM observation was performed after etching the surface of the copper plate. In the SEM observation, regions of a 5 mm×5 mm unit area were arbitrarily observed at three locations. The major diameters of the observed copper crystal grains were measured. Also, the deviation from the average value of the major diameters of the copper crystal grains was calculated from the results of observing the 5 mm×5 mm unit area at the arbitrary three locations.

The warp amount of the long side was measured as the warp amount of the bonded body. The warp amount of the ceramic substrate was measured from the side surface of the bonded body. The edge and the edge of the long side of the ceramic substrate were connected by a straight line. The most distant position of the ceramic substrate surface to the straight line was used as the warp amount. The example for which the warp amount of the long side was not more than 0.1 mm are displayed as good (○); and the examples greater than 0.1 mm are displayed as defective (×).

The bonding strength was measured using a peel test. Specifically, peel test samples were prepared using the bonding conditions of the examples and the comparative examples. In the samples, a rectangular copper plate was bonded to the ceramic substrate. At this time, the bonding was performed so that one end of the copper plate jutted from the ceramic substrate. The peel strength was measured by perpendicular pulling the jutting copper plate.

Examples for which the bonding strength was not less than 20 kN/m are displayed as best (◎). Examples of not less than 15 kN/m but less than 20 kN/m are displayed as good (○). Examples of not more than 14 kN/m are displayed as defective (×).

The results are shown in Table 5.

TABLE 5

| | Major diameters of copper crystal grains of copper plate | | | | | |
|---|---|---|---|---|---|---|
| | Number percentage of copper crystal grains having major diameters greater than 400 μm (%) | Average value of major diameters (μm) | Number percentage within range of 0.5 to 2 times average value (%) | Average value B after bonding/average value A before bonding | Warp amount | Bonding strength |
| Example 1 | 0 | 98 | 96 | 3.9 | ○ | ◎ |
| Example 2 | 1 | 145 | 84 | 3.6 | ○ | ◎ |
| Example 3 | 0 | 102 | 98 | 4.1 | ○ | ○ |
| Example 4 | 0 | 87 | 100 | 3.5 | ○ | ◎ |
| Example 5 | 0 | 85 | 100 | 2.1 | ○ | ◎ |
| Example 6 | 0 | 115 | 96 | 4.6 | ○ | ◎ |
| Example 7 | 3 | 185 | 82 | 7.4 | ○ | ◎ |
| Example 8 | 0 | 123 | 97 | 4.3 | ○ | ◎ |
| Comparative example 1 | 8 | 330 | 76 | 13.2 | × | ◎ |
| Comparative example 2 | 48 | 450 | 85 | 11.2 | × | ◎ |
| Comparative example 3 | Could not be bonded | | | | | |

It can be seen from the table that the copper crystal grains of the copper plate were controlled for the bonded bodies according to the examples. Also, good results were obtained for the warp amount and the bonding strength as well. This shows that a bonded body that has a sufficient strength is obtained even when the bonding temperature is not more than 800° C., and even not more than 700° C. Also, in the example 3, the bonding strength decreased because the silicon nitride substrates Wa and Wt were outside the favorable range.

Conversely, as in the comparative example 3, a bonded body is not obtained for a brazing material having a high melting point even when the bonding temperature is lowered. Also, in the comparative example 1 and the comparative example 2, the level of the grain growth of copper crystals was large because the bonding temperature was greater than 800° C. Therefore, the warp amount of the bonded body was large.

Thus, according to the examples, the warp amount of the bonded body can be reduced even when the size of the ceramic substrate is large. Also, a bonded body that has a high bonding strength can be obtained. Because the size of the ceramic substrate can be large, a bonded body that is suited to obtaining multiple components can be obtained.

While certain embodiments of the invention have been illustrated, these embodiments have been presented by way of example only, and are not intended to limit the scope of the inventions. These novel embodiments may be embodied in a variety of other forms; and various omissions, substitutions, modifications, etc., can be made without departing from the spirit of the inventions. These embodiments and their modifications are within the scope and spirit of the invention and are within the scope of the inventions described in the claims and their equivalents. Also, the embodiments described above can be implemented in combination with each other.

What is claimed is:

1. A bonded body, comprising:
   a ceramic substrate; and
   a copper plate bonded to the ceramic substrate via a bonding layer,
   the copper plate including a surface perpendicular to a direction in which the ceramic substrate and the copper plate are bonded,
   a number percentage of copper crystal grains having major diameters greater than 400 μm in three 5 mm×5 mm regions included in the surface being not less than 0% and not more than 5%, and
   an average value of the major diameters of the copper crystal grains in the three regions is not less than 30 μm and not more than 300 μm.

2. The body according to claim 1, wherein
   the number percentage is not more than 1%.

3. The body according to claim 1, wherein
   an average value of the major diameters of the copper crystal grains in the three regions is not less than 50 μm and not more than 150 μm.

4. The body according to claim 1, wherein
   a number percentage of the copper crystal grains having major diameters within an average range in the three regions is not less than 80%, and
   the average range is not less than 0.5 times and not more than 2 times an average value of the major diameters of the copper crystal grains in the three regions.

5. The body according to claim 1, wherein
   an arithmetic average height Wa of a waviness curve of the ceramic substrate is not more than 2 μm, and
   a maximum cross-sectional height Wt of the waviness curve is not more than 10 μm.

6. The body according to claim 1, wherein
   the bonding layer includes Ag, Cu, and Ti.

7. The body according to claim 1, wherein
   the ceramic substrate is one of a silicon nitride substrate or an aluminum nitride substrate.

8. The body according to claim 1, wherein
   an average value of the major diameters of the copper crystal grains in the three regions is not less than 30 μm and not more than 300 μm,
   a number percentage of the copper crystal grains having major diameters within an average range in the three regions is not less than 80%, and
   the average range is not less than 0.5 times and not more than 2 times an average value of the major diameters of the copper crystal grains in the three regions.

9. The body according to claim 8, wherein
   an arithmetic average height Wa of a waviness curve of the ceramic substrate is not more than 2 μm, and
   a maximum cross-sectional height Wt of the waviness curve is not more than 10 μm.

10. The body according to claim 9, wherein
    the bonding layer includes Ag, Cu, and Ti.

11. The body according to claim 10, wherein
    the ceramic substrate is one of a silicon nitride substrate or an aluminum nitride substrate.

12. A ceramic copper circuit board using the bonded body according to claim 1.

13. A method for manufacturing the bonded body according to claim 1, the method comprising:
    a process of disposing a brazing material used as the bonding layer between the ceramic substrate and the copper plate; and
    a bonding process including a bonding temperature of not more than 800° C.

14. The method according to claim 13, wherein the bonding temperature is not more than 700° C.

15. The method according to claim 13, wherein $B/A \leq 10$ is satisfied,
    A (μm) is an average value of the major diameters of the copper crystal grains of the copper plate before bonding, and
    B (μm) is an average value of the major diameters of the copper crystal grains of the copper plate after bonding.

16. The method according to claim 15, wherein $1.1 < B/A < 5$ is satisfied.

17. The method according to claim 13, wherein a largest endothermic peak of a DSC curve of the brazing material is at not more than 700° C.

18. A method for manufacturing a ceramic copper circuit board, the method comprising:
    a method for manufacturing the bonded body according to claim 1; and
    a process of providing a circuit structure in the bonded copper plate.

* * * * *